(12) United States Patent
Kawamura

(10) Patent No.: US 10,800,263 B2
(45) Date of Patent: Oct. 13, 2020

(54) GROUND FAULT DETECTION APPARATUS

(71) Applicant: Yazaki Corporation, Tokyo (JP)

(72) Inventor: Yoshihiro Kawamura, Makinohara (JP)

(73) Assignee: YAZAKI CORPORATION, Minato-ku, Tokyo (JP)

( * ) Notice: Subject to any disclaimer, the term of this patent is extended or adjusted under 35 U.S.C. 154(b) by 0 days.

(21) Appl. No.: 16/295,362

(22) Filed: Mar. 7, 2019

(65) Prior Publication Data

US 2019/0308505 A1 Oct. 10, 2019

(30) Foreign Application Priority Data

Apr. 9, 2018 (JP) ................... 2018-074546

(51) Int. Cl.
*B60L 3/00* (2019.01)
*G01R 27/02* (2006.01)
*G01R 31/50* (2020.01)

(52) U.S. Cl.
CPC .......... *B60L 3/0069* (2013.01); *G01R 27/025* (2013.01); *G01R 31/50* (2020.01)

(58) Field of Classification Search
CPC .. B60L 3/0046; B60L 3/0069; B60L 2240/80; G01R 27/025; G01R 31/006; G01R 31/007; G01R 31/02; G01R 31/024; G01R 31/025; G01R 31/1272; G01R 31/14; G01R 31/327; G01R 31/3275; G01R 31/3277; G01R 31/3278; G01R 31/382; G01R 31/40; G01R 31/50
USPC .......................... 324/503, 509, 510, 551, 557
See application file for complete search history.

(56) References Cited

U.S. PATENT DOCUMENTS

| | | | | | |
|---|---|---|---|---|---|
| 4,387,306 | A | * | 6/1983 | Sibley | ................ G01R 31/3278 307/125 |
| 4,762,663 | A | * | 8/1988 | Cook | ................... H01H 47/002 376/259 |
| 5,818,236 | A | * | 10/1998 | Sone | ..................... B60L 3/0023 324/509 |

(Continued)

FOREIGN PATENT DOCUMENTS

JP 2009-281986 A 12/2009

*Primary Examiner* — Steven L Yeninas
(74) *Attorney, Agent, or Firm* — Sughrue Mion, PLLC

(57) ABSTRACT

A ground fault detection apparatus includes a control unit, a detection capacitor, a positive-electrode-side first resistor connected to positive-electrode side of a high-voltage battery, a negative-electrode-side first resistor connected to negative-electrode side, a positive-electrode-side second resistor having one end grounded and another end, voltage of which being measured by the control unit, a negative-electrode-side second resistor having one end grounded, a positive-electrode-side C contact switch as a twin relay that alternatively switches connection destination of one end of the detection capacitor between a path including the positive-electrode-side first resistor and a path including the positive-electrode-side second resistor based on instruction from the control unit, and a negative-electrode-side C contact switch as a twin relay that alternatively switches connection destination of another end of the detection capacitor between a path including the negative-electrode-side first resistor and a path including the negative-electrode-side second resistor based on instruction from the control unit.

2 Claims, 11 Drawing Sheets

(56) References Cited

U.S. PATENT DOCUMENTS

| | | | |
|---|---|---|---|
| 6,459,241 B1* | 10/2002 | Yang | H02J 7/0047 |
| | | | 320/132 |
| 8,248,744 B2* | 8/2012 | Kawamura | G01R 19/0084 |
| | | | 361/79 |
| 2009/0289640 A1 | 11/2009 | Kawamura et al. | |
| 2011/0006781 A1* | 1/2011 | Kawamura | G01R 31/52 |
| | | | 324/551 |
| 2011/0012606 A1* | 1/2011 | Kawamura | G01R 31/50 |
| | | | 324/509 |
| 2013/0182361 A1* | 7/2013 | Sexton | H02H 11/002 |
| | | | 361/79 |
| 2015/0293167 A1* | 10/2015 | Kawamura | B60L 3/0069 |
| | | | 324/551 |
| 2018/0315565 A1* | 11/2018 | Zhang | G01R 31/3278 |

* cited by examiner

STOPPAGE/MEASUREMENT STATE

V0 MEASUREMENT PERIOD

GROUND FAULT DETECTION APPARATUS

BACKGROUND

Technical Field

The present invention relates to a ground fault detection apparatus using a flying capacitor.

Related Art

In vehicles such as a hybrid vehicle having an engine and an electric motor as a driving source and an electric vehicle, a battery mounted on a vehicle body is charged and a propulsive force is generated by using electric energy supplied from the battery. Generally, a battery-related power supply circuit is configured as a high-voltage circuit that handles a high voltage of 200 V or higher, and in order to ensure safety, the high-voltage circuit including the battery has a non-grounded configuration in which the high-voltage circuit is electrically insulated from a vehicle body that is a ground reference potential point.

In a vehicle equipped with a non-grounded high-voltage battery, a ground fault detection apparatus is provided in order to monitor an insulation state (ground fault) between the vehicle body and a system provided with the high-voltage battery, more specifically, a main power supply system extending from the high-voltage battery to a motor. In the ground fault detection apparatus, a system using a capacitor called a flying capacitor is widely used.

FIG. 10 is a diagram illustrating an example of a circuit of a flying capacitor type ground fault detection apparatus in the related art. As shown, a ground fault detection apparatus 400 is a device connected to a non-grounded high-voltage battery 300 to detect a ground fault of a system provided with the high-voltage battery 300. Here, an insulation resistor between a positive-electrode side of the high-voltage battery 300 and a ground is represented as RLp, and an insulation resistor between a negative-electrode side of the high-voltage battery 300 and the ground is represented as RLn.

As shown, the ground fault detection apparatus 400 includes a detection capacitor C1 operating as a flying capacitor. Further, in order to switch a measurement path and to control charging and discharging of the detection capacitor C1, four switching elements S1 to S4 are provided around the detection capacitor C1. Further, a switching element Sa for sampling a measurement voltage corresponding to the charging voltage of the detection capacitor C1 is provided.

In the ground fault detection apparatus 400, in order to grasp insulation resistances RLp and RLn, a measurement operation is repeated with V0 measurement period→Vc1n measurement period→V0 measurement period→Vc1p measurement period as one cycle. In all of the measurement periods, the charging voltage of the detection capacitor C1 is measured after charging the detection capacitor C1 with a voltage to be measured. Then, for the subsequent measurement, the detection capacitor C1 is discharged.

In the V0 measurement period, a voltage corresponding to the voltage of the high-voltage battery 300 is measured. Therefore, switching elements S1 and S2 are turned on and switching elements S3 and S4 are turned off, whereby the detection capacitor C1 is charged. That is, as illustrated in FIG. 11A, the high-voltage battery 300, a resistor R1, and the detection capacitor C1 serve as a measurement path.

At the time of measuring the charging voltage of the detection capacitor C1, as illustrated in FIG. 11B, the switching elements S1 and S2 are turned off, the switching elements S3 and S4 are turned on, and the switching element Sa is turned on, whereby sampling is performed with a control device 420. Thereafter, as illustrated in FIG. 11C, the switching element Sa is turned off, and the detection capacitor C1 is discharged for the subsequent measurement. At the time of measuring the charge voltage of the detection capacitor C1, the operation at the time of discharging the detection capacitor C1 is the same in other measurement periods.

In the Vc1n measurement period, a voltage reflecting an influence of the insulation resistance RLn is measured. Therefore, the switching elements S1 and S4 are turned on and the switching elements S2 and S3 are turned off, whereby the detection capacitor C1 is charged. That is, as illustrated in FIG. 12A, the high-voltage battery 300, the resistor R1, the detection capacitor C1, a resistor R4, the ground, and the insulation resistor RLn serve as a measurement path.

In the Vc1p measurement period, a voltage reflecting the influence of the insulation resistor RLp is measured. Therefore, the switching elements S2 and S3 are turned on and the switching elements S1 and S4 are turned off, whereby the detection capacitor C1 is charged. That is, as illustrated in FIG. 12B, the high-voltage battery 300, the insulation resistor RLp, the ground, the resistor R3, the resistor R1, and the detection capacitor C1 serve as a measurement path.

It is known that $(RLp \times RLn)/(RLp+RLn)$ can be obtained based on $(Vc1p+Vc1n)/V0$ calculated from V0, Vc1n and Vc1p obtained in these measurement periods. Therefore, the control device 420 in the ground fault detection apparatus 400 can grasp the insulation resistances RLp and RLn by measuring V0, Vc1n and Vc1p. Then, when the insulation resistances RLp and RLn become equal to or lower than a predetermined determination reference level, it is determined that a ground fault has occurred, and an alarm is outputted.

Patent Literature 1: JP 2009-281986 A

SUMMARY

In the related art, a ground fault detection apparatus is configured by using four optical MOS-FETs which are insulating type switching elements as switching elements S1 to S4. However, the optical MOS-FET is expensive, which causes an increase in cost of the ground fault detection apparatus.

Accordingly, an object of the present invention is to provide a ground fault detection apparatus using a flying capacitor in which an increase in cost due to a switching element is suppressed.

In order to solve the aforementioned problem, a ground fault detection apparatus according to the present invention provides a ground fault detection apparatus that is connected to a non-grounded high-voltage battery and detects a ground fault of a system provided with the high-voltage battery, the ground fault detection apparatus including: a control unit; a detection capacitor that operates as a flying capacitor; a positive-electrode-side first resistor connected to a positive-electrode side of the high-voltage battery; a negative-electrode-side first resistor connected to a negative-electrode side of the high-voltage battery; a positive-electrode-side second resistor having a first end grounded and a second end, a voltage of the second end being measured by the control unit; a negative-electrode-side second resistor having a first end grounded; a positive-electrode-side C contact switch that is formed as a twin relay in which a first relay and a second relay operate in conjunction with each other and alternatively switches a connection destination of a first end of the detection capacitor between a path including the positive-electrode-side first resistor and a path including the positive-electrode-side second resistor based on an instruction from the control unit; and a negative-electrode-side C contact switch that is formed as a twin relay in which a third relay and a fourth relay operate in conjunction with each other and alternatively switches a connection destination of a second end of the detection capacitor between a path including the negative-electrode-side first resistor and a path including the negative-electrode-side second resistor based on an instruction from the control unit, wherein the first relay is disposed so as to alternatively switch the connection destination of the first end of the detection capacitor between the path including the positive-electrode-side first resistor and one of contacts of the second relay, the second relay functions as a change-over switch that switches a connecting state of a connected contact of the first relay and the positive-electrode-side second resistor to an off state while the first relay being switched to the path including the positive-electrode-side first resistor, the third relay is disposed so as to alternatively switch the connection destination of the second end of the detection capacitor between the path including the negative-electrode-side first resistor and one of contacts of the fourth relay, and the fourth relay functions as a change-over switch that switches a connecting state of a connected contact of the third relay and the negative-electrode-side second resistor to an off state while the third relay being switched to the path including the negative-electrode-side first resistor.

Here, the apparatus may include a change-over switch provided on the side of the positive-electrode-side first resistor of the positive-electrode-side C contact switch and on the side of the negative-electrode-side first resistor of the negative-electrode-side C contact switch, and is configured to switch on and off in conjunction with the positive-electrode-side C contact switch and the negative-electrode-side C contact switch.

According to the present invention, in the ground fault detection apparatus using a flying capacitor, an optical MOS-FETs which cause an increase in cost is not used, thus an increase in cost due to the switching element can be suppressed.

DETAILED DESCRIPTION

Figure 1:
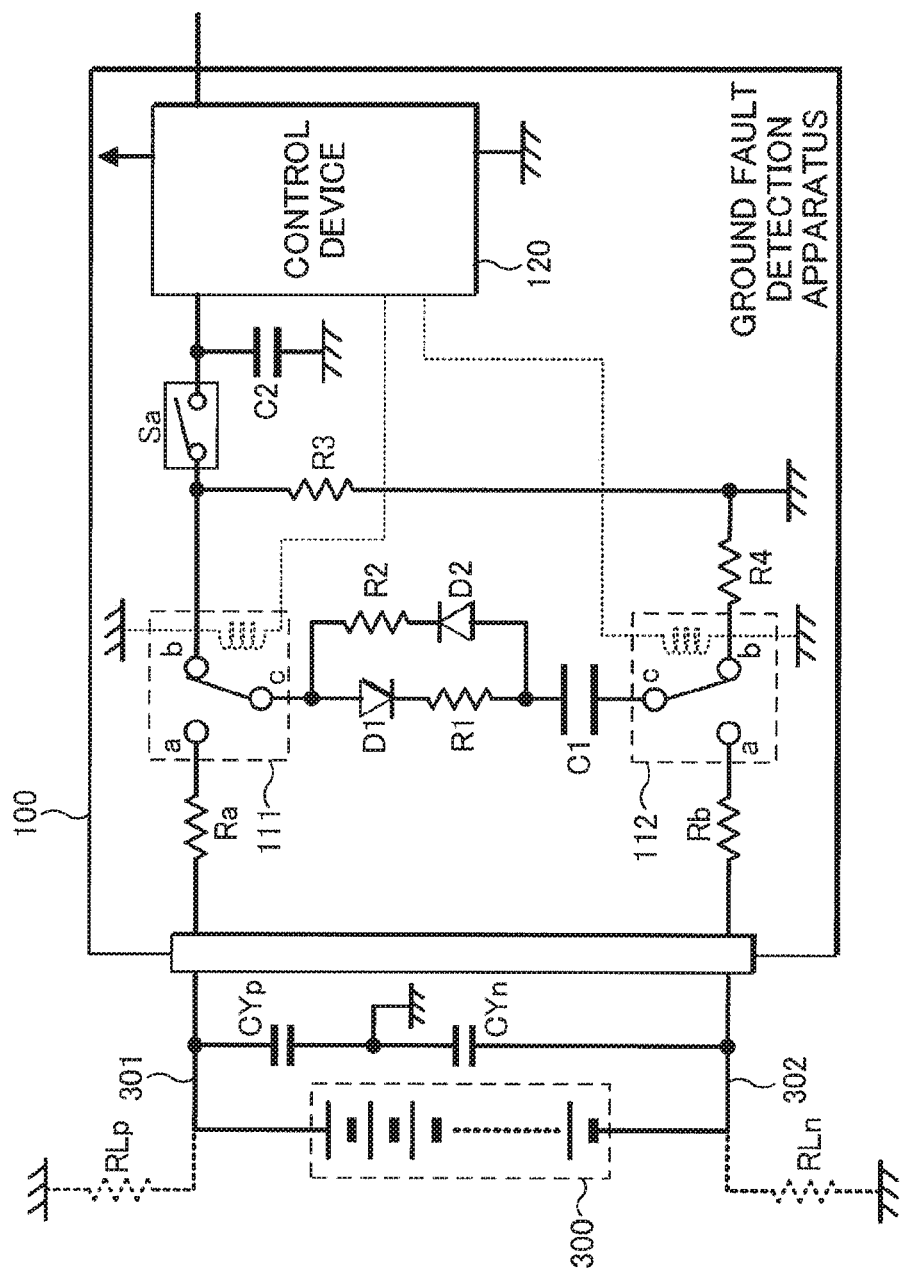
FIG. 1 is a block diagram illustrating a configuration of a ground fault detection apparatus according to an embodiment of the present invention.

Embodiments of the present invention will be described in detail with reference to the drawings. FIG. 1 is a block diagram illustrating a configuration of a ground fault detection apparatus 100 according to an embodiment of the present invention. As shown, the ground fault detection apparatus 100 is a flying capacitor type apparatus which is connected to a non-grounded high-voltage battery 300 and detects a ground fault of a system provided with the high-voltage battery 300. Herein, an insulation resistor between a positive-electrode side of the high-voltage battery 300 and a ground is represented as RLp, and an insulation resistor between a negative-electrode side of the high-voltage battery 300 and the ground is represented as RLn. High voltage means a voltage higher than a low-voltage battery (generally 12 V) for driving various devices (lamps, wipers, etc.) in a vehicle, and the high-voltage battery 300 is a battery used for driving a vehicle travelling.

The high-voltage battery 300 is constituted of a rechargeable battery such as a lithium ion battery, discharges via a high-voltage bus bar (not illustrated), and drives an electric motor connected via an inverter or the like. Further, during regeneration or charging equipment connection, charging is performed via the high-voltage bus bar.

In order to remove a high-frequency noise of a power supply or stabilize an operation, capacitors CYp and CYn called as an Y capacitor (a line bypass capacitor) are respectively connected between a positive-electrode-side power supply line 301 of the high-voltage battery 300 and a ground electrode and between a negative-electrode-side power supply line 302 and the ground electrode. However, the Y capacitor may be omitted.

As shown, the ground fault detection apparatus 100 includes a detection capacitor C1 operating as a flying capacitor and a switching element Sa for sampling a measurement voltage corresponding to a charging voltage of the detection capacitor C1. However, it is also possible to omit the switching element Sa. In addition, a control device 120 constituted of a microcomputer or the like is provided. The control device 120 executes a program incorporated in advance to execute various controls, such as a switch switching processing to be described below, required for the ground fault detection apparatus 100.

As described with reference to FIGS. 11A to 12B, in the measurement path in each measurement period, a switching element S1 and a switching element S3 of a system of the positive-electrode-side power supply line 301 are not simultaneously turned on, and a switching element S2 and a switching element S4 of a system of the negative-electrode-side power supply line 302 are not simultaneously turned on. That is, the switching element S1 and the switching element S3 are exclusively switched, and the switching element S2 and the switching element S4 are exclusively switched.

Therefore, in the ground fault detection apparatus 100, a positive-electrode-side C contact switch 111 is used as the switching element of the system of the positive-electrode-side power supply line 301, and the negative-electrode-side C contact switch 112 is used as the switching element of the system of the negative-electrode-side power supply line 302. The positive-electrode-side C contact switch 111 and the negative-electrode-side C contact switch 112 can be constituted of, for example, a high-withstand-voltage-small-signal mechanical relay or a reed relay.

The positive-electrode-side C contact switch 111 and the negative-electrode-side C contact switch 112 are each provided with a common contact c on the side of the detection capacitor C1. Specifically, the common contact c of the positive-electrode-side C contact switch 111 is connected to a first end (positive-electrode side) of the detection capacitor C1 via a parallel circuit of a path of a diode D1 and a resistor R1 and a path of a resistor R2 and a diode D2, and the common contact c of the negative-electrode-side C contact switch 112 is connected to a second end (negative-electrode side) of the detection capacitor C1. The diode D1 serving as a path during charging is connected in a direction in which the direction from the positive-electrode-side C contact switch 111 to the detection capacitor C1 is a forward direction, and the diode D2 serving as a path during discharging is connected in a reverse direction. The resistor R1 functions as a charge resistor and the resistor R2 functions as a discharge resistor.

A contact a of the positive-electrode-side C contact switch 111 is connected to the positive-electrode-side power supply line 301 via the resistor Ra, and a contact a of the negative-electrode-side C contact switch 112 is connected to the negative-electrode-side power supply line 302 via a resistor Rb. That is, each of the C contact switches has the contact a on the side of the high-voltage battery 300.

A contact b of the positive-electrode-side C contact switch 111 is connected to the switching element Sa and connected to the resistor R3 having the other end grounded. The contact b of the negative-electrode-side C contact switch 112 is connected to the resistor R4 having the other end grounded. That is, each of the C contact switches has the contact b on the side of the control device 120 (ground).

As illustrated in FIG. 1, the positive-electrode-side C contact switch 111 and the negative-electrode-side C contact switch 112 are independently controlled and switched by the control device 120. The control device 120 switches the measurement path by controlling switching of the positive-electrode-side C contact switch 111, the negative-electrode-side C contact switch 112, and the switching element Sa independently, and performs charging and discharging of the detection capacitor C1 and measuring a charging voltage.

Specifically, in the V0 measurement period, both the positive-electrode-side C contact switch 111 and the negative-electrode-side C contact switch 112 are switched to the contact a, thus forming a measurement path of the high-voltage battery 300, the resistor Ra, the resistor R1, the detection capacitor C1, and the resistor Rb.

At the time of measuring the charging voltage of the detection capacitor C1, both the positive-electrode-side C contact switch 111 and the negative-electrode-side C contact switch 112 are switched to the contact b to turn on the switching element Sa. Thereafter, the switching element Sa is turned off to discharge the detection capacitor C1 by mainly using the resistor R2 for the subsequent measurement. At the time of measuring the charge voltage of the detection capacitor C1, the operation at the time of discharging is the same in other measurement periods.

In the Vc1n measurement period, the positive-electrode-side C contact switch 111 is switched to the contact a, and the negative-electrode-side C contact switch 112 is switched to the contact b, thus forming a measurement path of the high-voltage battery 300, the resistor Ra, the resistor R1, the detection capacitor C1, the resistor R4, the ground, and the insulation resistor RLn.

In the Vc1p measurement period, the positive-electrode-side C contact switch 111 is switched to the contact b, and the negative-electrode-side C contact switch 112 is switched to the contact a, thus forming a measurement path of the high-voltage battery 300, the insulation resistor RLp, the ground, the resistor R3, the resistor R1, the detection capacitor C1 and a resistor Rb.

In the ground fault detection apparatus 100, the resistor Ra, the resistor Rb, and the resistor R1 have high resistances of about several hundred kΩ, for example, and the resistor R2, the resistor R3, and the resistor R4 have low resistances of about several kΩ, for example.

Separately from the resistor R1, the resistor Ra is disposed on the positive-electrode side and the resistor Rb is disposed on the negative-electrode side, and the positive-electrode-side C contact switch 111 and the negative-electrode-side C contact switch 112 are constituted of the C contact relay. Thus, even if sticking occurs in either of the C contact switches, either the resistor Ra or the resistor Rb having high resistance is interposed between the high-voltage battery 300 and the control device 120, thereby limiting current. Therefore, the control device 120 and an energizing circuit can be protected.

Further, even if the contact a and the contact b are short-circuited by one of the C contact switches, either the resistor Ra or the resistor Rb having high resistance is interposed between the high-voltage battery 300 and the control device 120 to limit the current, thereby protecting the control device 120.

Further, assuming that a reference value for determining the ground fault with respect to the insulation resistance RLp and the insulation resistance RLn is RLs, when the insulation resistance RLp and the insulation resistance RLn are the reference value RLs, each resistance value is determined in accordance with a relationship of R1+Ra+Rb=R1+R4+Ra+RLn=R1+R3+Rb+RLp so that the resistance value on the path is the same in the V0 measurement period, the Vc1n measurement period and the Vc1p measurement period, whereby it is possible to prevent a ground fault detection accuracy from decreasing due to an influence of DC bias characteristic even when a ceramic capacitor is used as the detection capacitor C1.

It can be determined appropriately which of the contact a on the side of the high-voltage battery 300 and the contact b on the side of the control device 120 (the ground) is set to a normal closing in the positive-electrode-side C contact switch 111 and the negative-electrode-side C contact switch 112, considering the following characteristics:

1) When the contact a on the side of the high-voltage battery 300 is set to the normal closing for both the positive-electrode-side C contact switch 111 and the negative-electrode-side C contact switch 112, the high-voltage voltage is already charged to the detection capacitor C1 at the start of startup of the ground fault detection apparatus 100, thus omitting the charging process in the first V0 measurement period. For this reason, it is possible to respond to a functional need of quickening a ground fault determination compared to a normal time in order to ensure safety at the startup;

2) When the contact b on the side of the control device 120 (ground) is set to the normal closing for both the positive-electrode-side C contact switch 111 and the negative-electrode-side C contact switch 112, the detection capacitor C1 is in the discharged state when the operation is stopped. For this reason, risk of electric shock is reduced, for example, when the ground fault detection apparatus 100 is removed; and 3) When the contact a of any one of the positive-electrode-side C contact switch 111 and the negative-electrode-side C contact switch 112 is set to the normal closing, the detection capacitor C1 is charged with a voltage between any one of electrodes and the ground at the time of the startup. By measuring the voltage and comparing it with that of the normal state, it is possible to quickly grasp a situation in which the insulation resistance of one of the electrodes is reduced in a simple manner.

As described above, since the ground fault detection apparatus 100 according to the present embodiment does not use an optical MOS-FET that causes a cost increase as a change-over switch of the measurement path for the ground fault detection, an increase in cost due to the switching element can be suppressed.

In addition, since the four switching elements of the related art are replaced by the two C contact switches, the number of components as well as control lines can be reduced as compared with the related art. Further, since it is easy to miniaturize the C contact switch, space saving is also possible.

Figure 2:
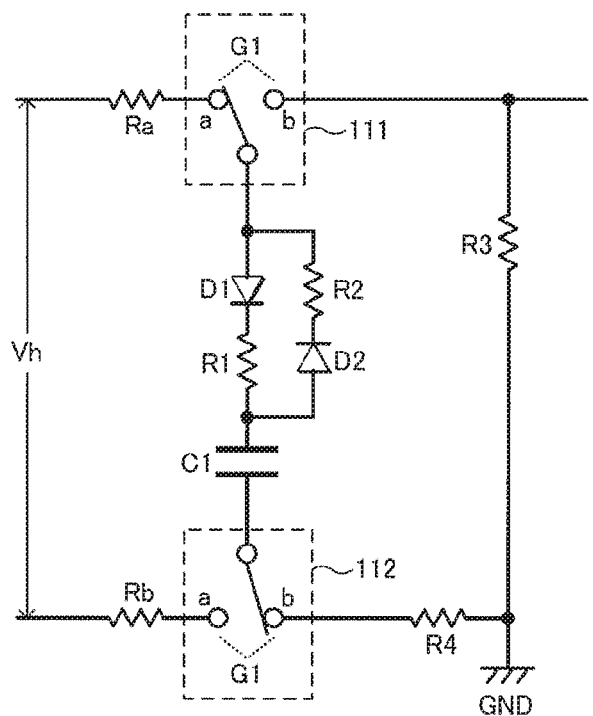
FIG. 2 is a diagram for describing a spatial distance according to the present embodiment.

In the following, a spatial distance between a high voltage Vh and a ground (GND) by the high-voltage battery 300 will be described with reference to FIG. 2. In a circuit configuration illustrated in FIG. 1, a contact gap (G1) corresponding to one relay is the spatial distance between the high voltage Vh and the ground (GND) in the switched states of both the contact a and the contact b, for both the positive-electrode-side C contact switch 111 and the negative-electrode-side C contact switch 112.

Compared with an optical MOS-FET, the relay has the characteristic of being advantageous in terms of securing the spatial distance. However, it is preferable that the spatial distance between the high voltage Vh and the ground (GND) is as large as possible, in view of a voltage-withstanding performance and further safety securing at the time of occurrence of the ground fault, for example.

Figure 3:
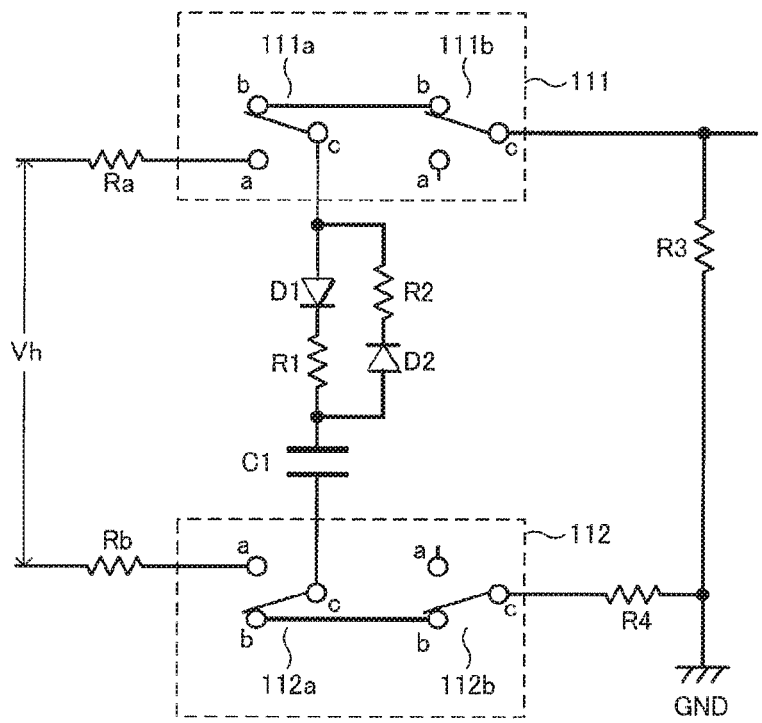
FIG. 3 is a diagram illustrating a first example to increase the spatial distance.

Therefore, as illustrated in FIG. 3, the positive-electrode-side C contact switch 111 may be constituted of a twin relay of single coil 2C contacts (a C contact relay 111a and a C contact relay 111b) which is simultaneously switched by one control, and the negative-electrode-side C contact switch 112 may be constituted of a twin relay of single coil 2C contacts (a C contact relay 112a and a C contact relay 112b) which is simultaneously switched by one control.

At this time, the C contact relay 111a is disposed so as to alternatively switch a connection destination of a positive-electrode side of the detection capacitor C1 between a path including the resistor Ra and one of the contacts of the C contact relay 111b, and the C contact relay 111b is disposed to function as a change-over switch that switches a connecting state of a connected contact of the C contact relay 111a and the resistor R3 to an off state while the C contact relay 111a being switched to the path including the resistor Ra. The common contacts c are arranged not connected to each other.

Further, the C contact relay 112a is disposed so as to alternatively switch a connection destination of a negative-electrode side of the detection capacitor C1 between a path including the resistor Rb and one of the contacts of the C contact relay 112b, and the C contact relay 112b is disposed to function as a change-over switch that switches a connecting state of a connected contact of the C contact relay 112a and the resistor R4 to an off state while the C contact relay 112a being switched to the path including the resistor Rb. The common contacts c are arranged not connected to each other.

In the example of FIG. 3, the positive-electrode-side C contact switch 111 is constituted of a twin relay of the C contact relay 111a and the C contact relay 111b, and the contacts b of the C contact relay 111a and the C contact relay 111b are connected to each other.

The contact a and the common contact c of the C contact relay 111a disposed on the side of the high voltage Vh are connected to each other in the same manner as the contact a and the common contact c of the positive-electrode-side C contact switch 111. That is, the contact a is connected to the positive-electrode-side power supply line 301 via the resistor Ra, and the common contact c is connected to the positive-electrode side of the detection capacitor C1 via a parallel circuit of a path of the diode D1 and the resistor R1 and a path of the resistor R2 and the diode D2.

The C contact relay 111b disposed on the side of the ground (GND) functions as a change-over switch that is switched off when the C contact relay 111a is switched to the high voltage Vh (contact a). That is, the contact a is open, and the common contact c is connected to the switching element Sa and is connected to the resistor R3.

In addition, the negative-electrode-side C contact switch 112 is constituted of a twin relay of the C contact relay 112a and the C contact relay 112b, and the contacts b of the C contact relay 112a and the C contact relay 112b are connected to each other.

The contact a and the common contact c of the C contact relay 112a disposed on the side of the high voltage Vh are connected to each other in the same manner as the contact a and the common contact c of the negative-electrode-side C contact switch 112. That is, the contact a is connected to the negative-electrode-side power supply line 302 via the resistor Rb, and the common contact c is connected to the negative-electrode side of the detection capacitor C1.

The C contact relay 111b disposed on the side of the ground (GND) functions as a change-over switch that is switched off when the C contact relay 111a is switched to the high voltage Vh (contact a). That is, the contact a is open, and the common contact c is connected to the resistor R4.

Figure 4A:
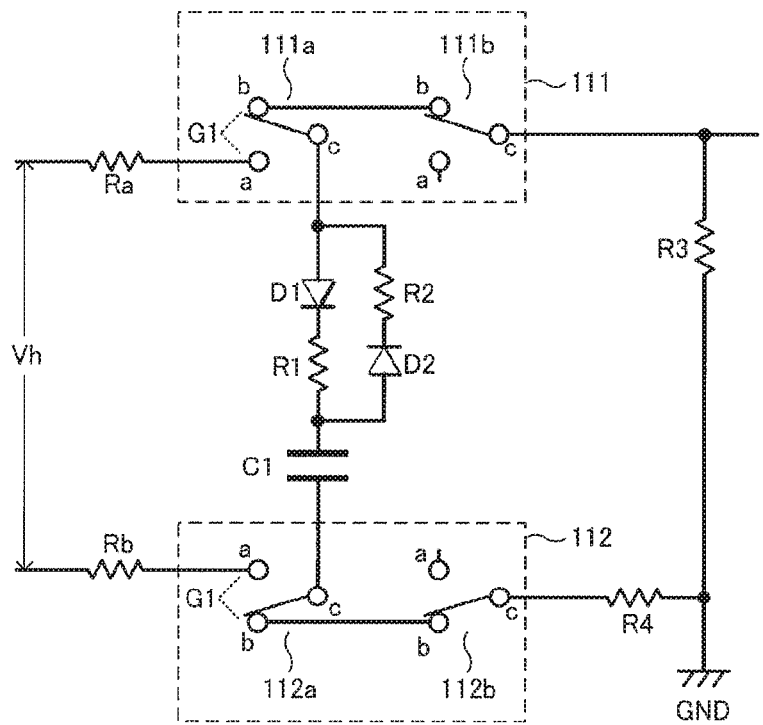
FIGS. 4A and 4B are diagrams illustrating the first example to increase the spatial distance.
Figure 4B:
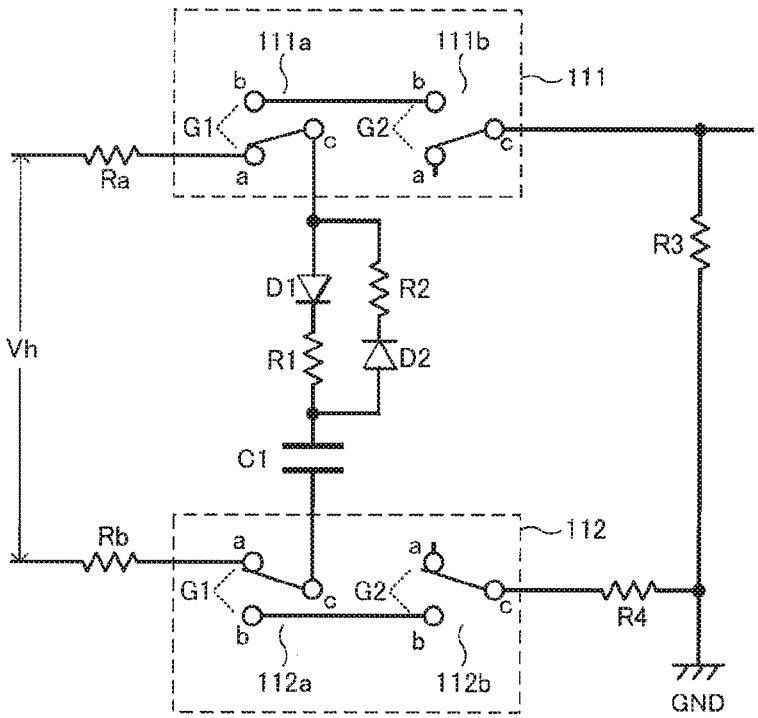

According to the aforementioned configuration, there is the contact gap (G1) corresponding to one relay for both the positive-electrode side and the negative-electrode side in the state of stoppage or charge voltage measurement, as illustrated in FIG. 4A. However, a contact gap corresponding to two relays can be secured, provided by the contact gap (G1) and the contact gap (G2) for both the positive-electrode side and the negative-electrode side in the V0 measurement period as illustrated in FIG. 4B.

Figure 5A:
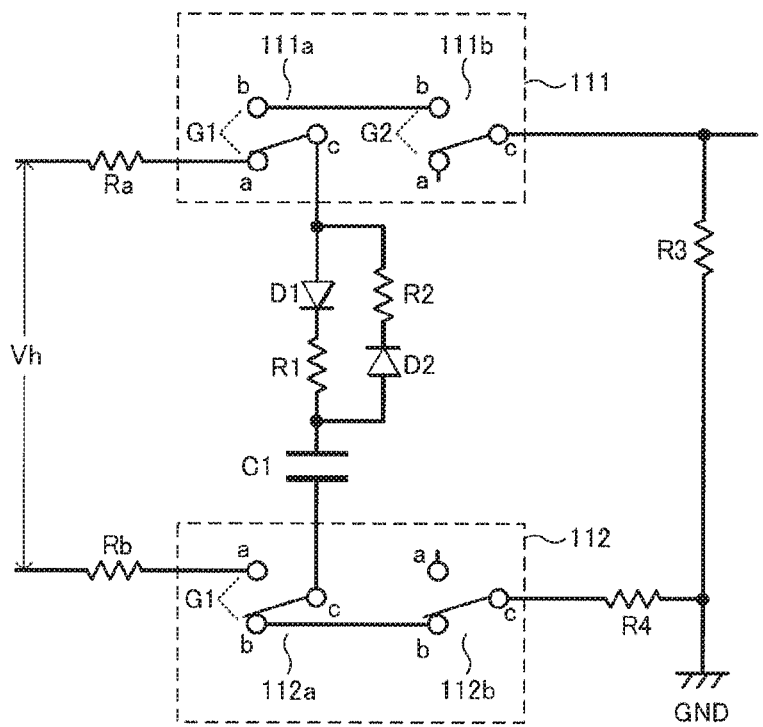
FIGS. 5A and 5B are diagrams illustrating the first example to increase the spatial distance.
Figure 5B:
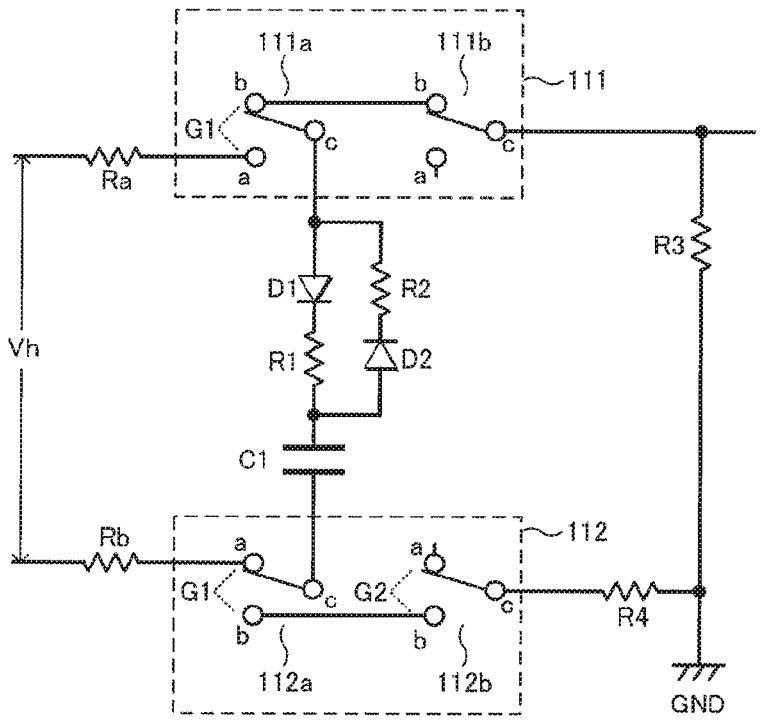

In the VC1n measurement period, as illustrated in FIG. 5A, a contact gap corresponding to two relays can be secured, provided by the contact gap (G1) and the contact gap (G2) on the positive-electrode side, and there is a contact gap corresponding to one relay provided by the contact gap (G1) on the negative-electrode side. In the VC1p measurement period, as illustrated in FIG. 5B, the contact gap corresponding to one relay is provided by the contact gap (G1) on the positive-electrode side, and a contact gap corresponding to two relays can be securely provided by the contact gap (G1) and the contact gap (G2) on the negative-electrode side.

As described above, in the configuration illustrated in FIG. 3, the two contacts are interposed in series between the high voltage Vh and the ground (GND), whereby a spatial distance between the high voltage Vh and the ground (GND) can be increased, thereby improving a voltage-withstanding characteristic of a circuit.

Figure 6:
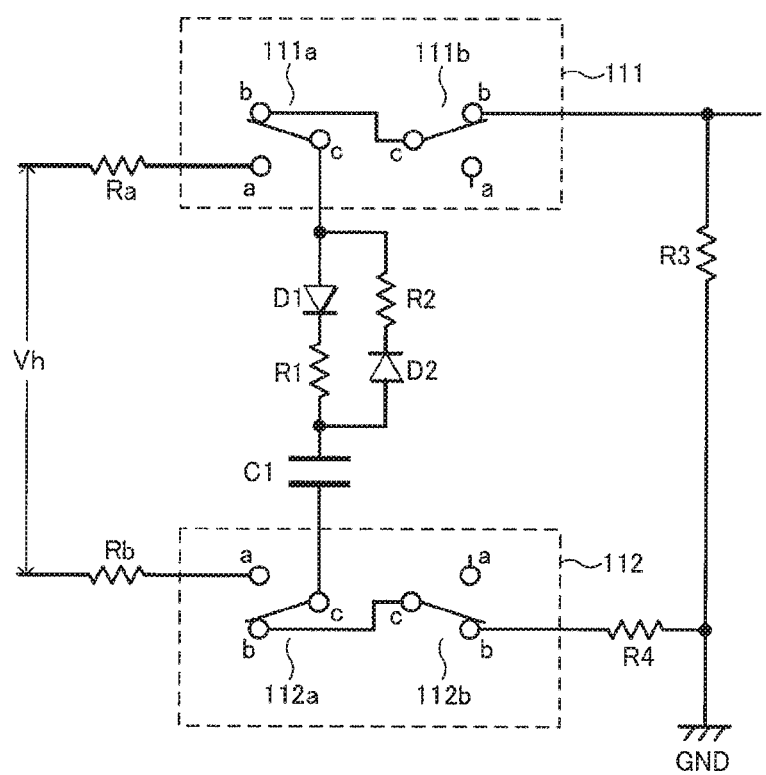
FIG. 6 is a diagram illustrating a second example to increase the spatial distance.

In order to increase the spatial distance between the high voltage Vh and the ground (GND), the connection as illustrated in FIG. 6 may be used. In the example shown, the positive-electrode-side C contact switch 111 is constituted of a twin relay including the C contact relay 111a and the C contact relay 111b, and the contact b of the C contact relay 111a and the common contact c of the C contact relay 111b are connected to each other.

The connecting state of the C contact relay 111a and the C contact relay 111b disposed on the side of the ground (GND) differs from the configuration illustrated in FIG. 3. However, it is the same in that, it functions as a change-over switch that is switched off while the C contact relays 111a and 112a on the side of the high voltage being switched to the high voltage Vh side (a contact).

Specifically, in the C contact relay 111b, the contact a is open, the contact b is connected to the switching element Sa and is connected to the resistor R3. In the C contact relay 112b, the contact a is open, and the common contact c is connected to the resistor R4.

Figure 7A:
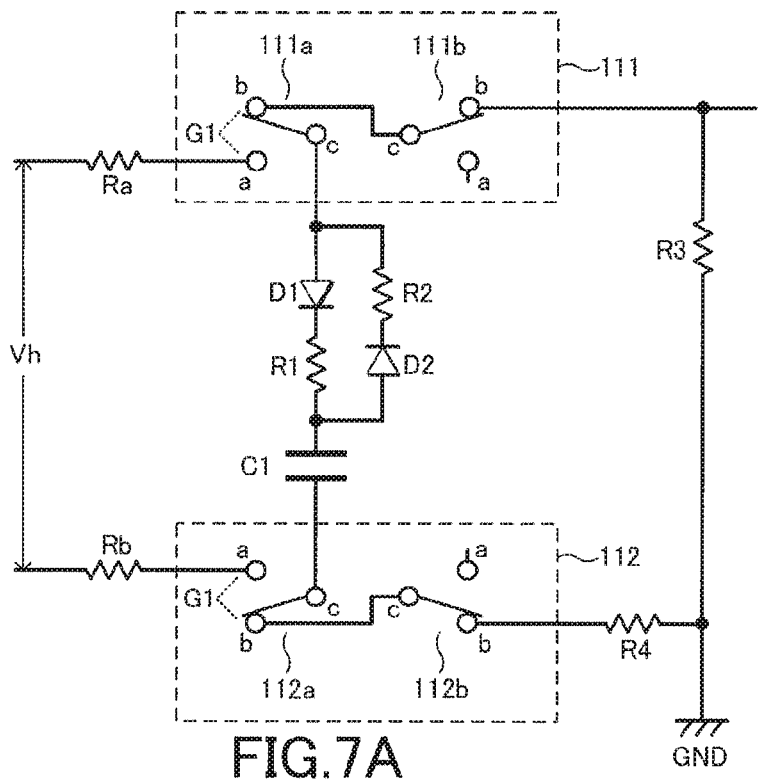
FIGS. 7A and 7B are diagrams illustrating the second example to increase the spatial distance.
Figure 7B:
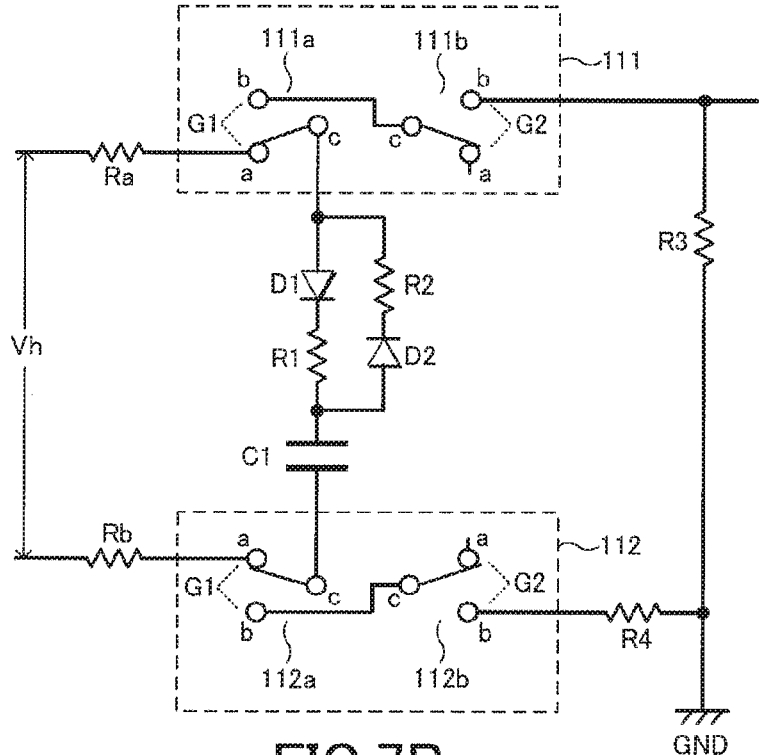

According to the aforementioned configuration, the contact gap (G1) corresponding to one relay is provided for both the positive-electrode side and the negative-electrode side in the state of stoppage or charge voltage measurement, as illustrated in FIG. 7A. However, a contact gap corresponding to two relays can be secured by the contact gap (G1) and the contact gap (G2) for both the positive-electrode side and the negative-electrode side in the V0 measurement period, as illustrated in FIG. 7B.

Figure 8A:
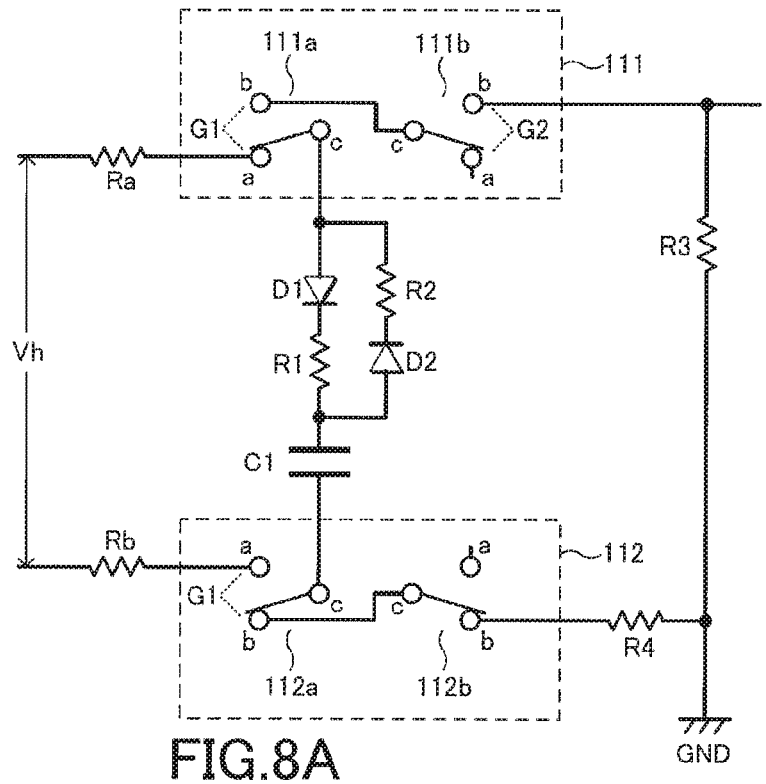
FIGS. 8A and 8B are diagrams illustrating the second example to increase the spatial distance.
Figure 8B:
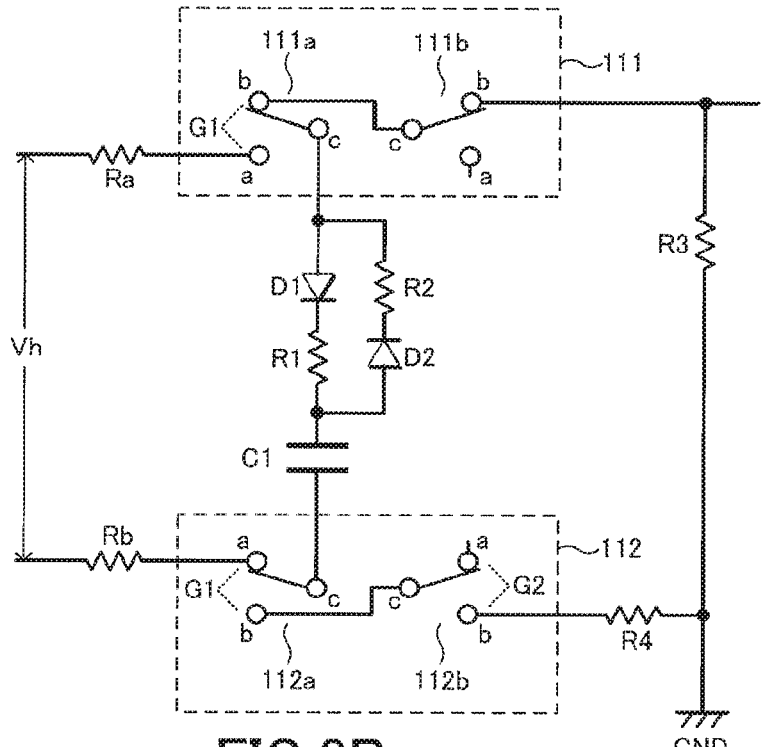

In the VC1n measurement period, as illustrated in FIG. 8A, a contact gap corresponding to two relays can be secured by the contact gap (G1) and the contact gap (G2) on the positive-electrode side, and the contact gap corresponding to one relay is provided by the contact gap (G1) on the negative-electrode side. In the VC1p measurement period, as illustrated in FIG. 8B, the contact gap corresponding to one relay is provided by the contact gap (G1) on the positive-electrode side, and a contact gap corresponding to two relays can be secured by the contact gap (G1) and the contact gap (G2) on the negative-electrode side.

As described above, in the configuration illustrated in FIG. 6 also, two contacts are interposed in series between the high voltage Vh and the ground (GND), whereby a spatial distance between the high voltage Vh and the ground (GND) can be increased, thereby improving a voltage-withstanding characteristic of a circuit.

In the configurations illustrated in FIGS. 3 and 6, there may be a state in which the spatial distance is the contact gap corresponding to one relay. However, in any configuration, a twin relay 113 that functions as the change-over switch that is switched on or off may be provided on the high voltage side of the positive-electrode-side C contact switch 111 and the negative-electrode-side C contact switch 112, as illustrated in FIG. 9, whereby the contact gap corresponding to two relays including additional contact gap (G3) can be secured at the positive-electrode side and the negative-electrode side in the state of stoppage or charge voltage measurement, the VC1n measurement period, and the VC1p measurement period.

Figure 9:
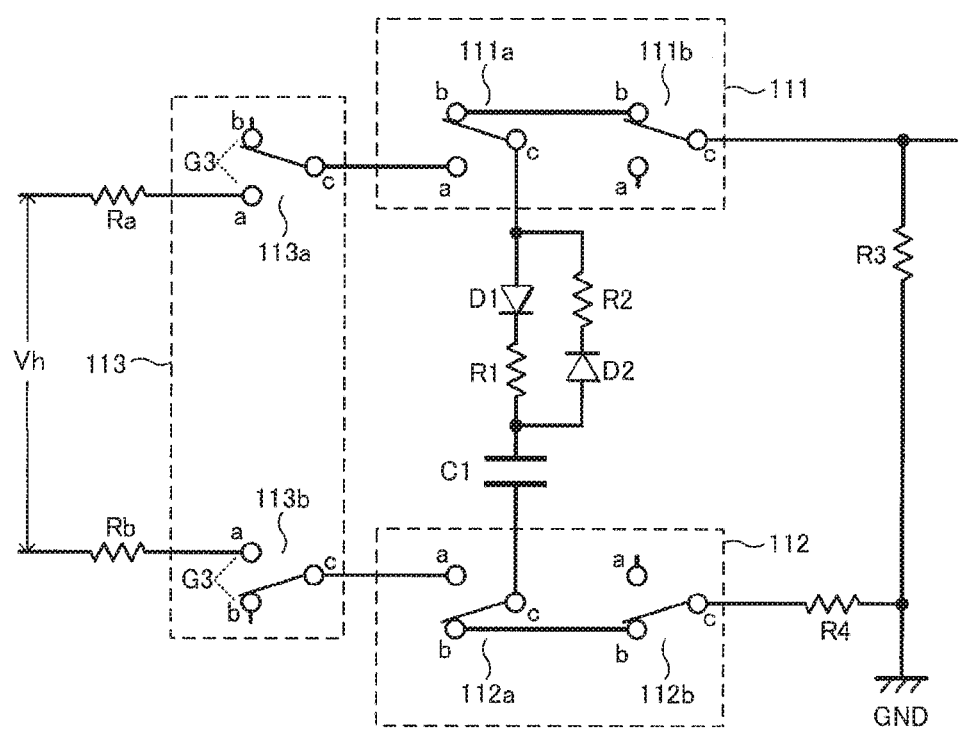
FIG. 9 is a diagram illustrating a third example to increase the spatial distance.
Figure 10:
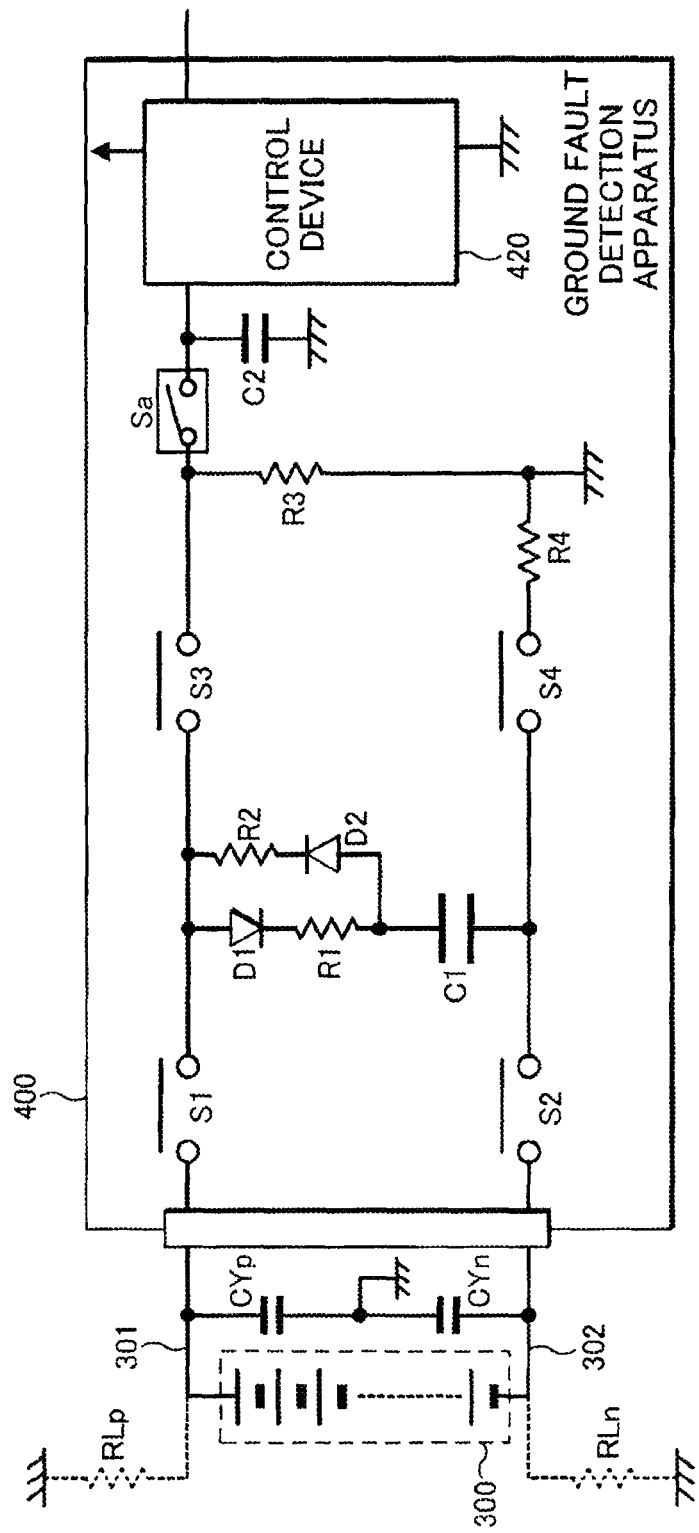
FIG. 10 is a diagram illustrating an example of a circuit of a flying capacitor type ground fault detection apparatus in the related art.
Figure 11A:
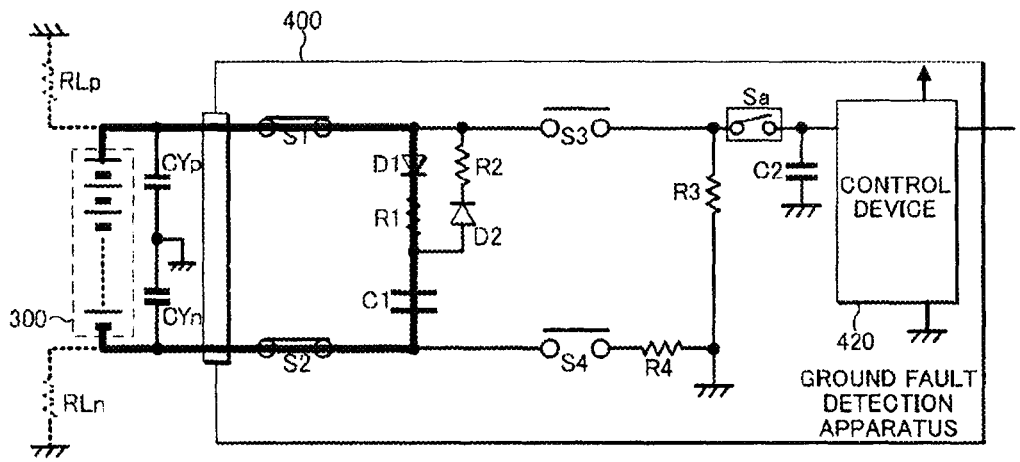
FIGS. 11A to 11C are diagrams illustrating a measurement path in a V0 measurement period.
Figure 11B:
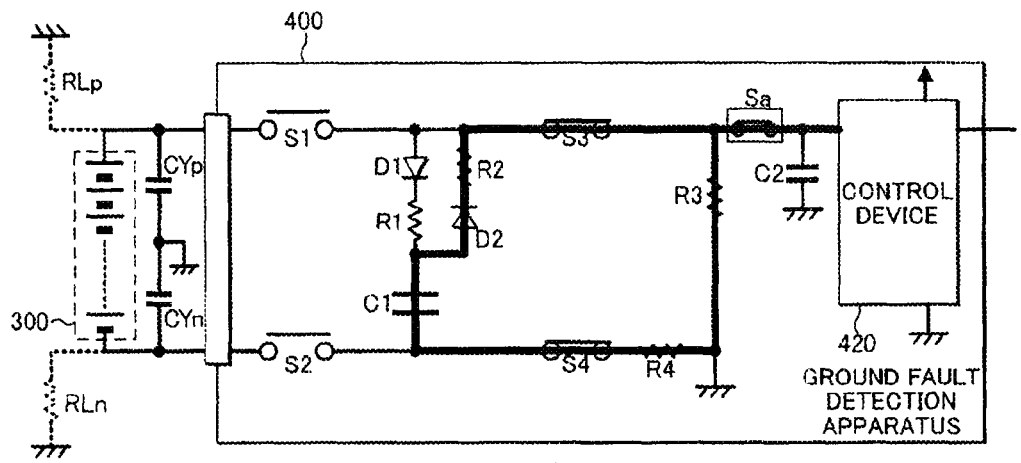
Figure 11C:
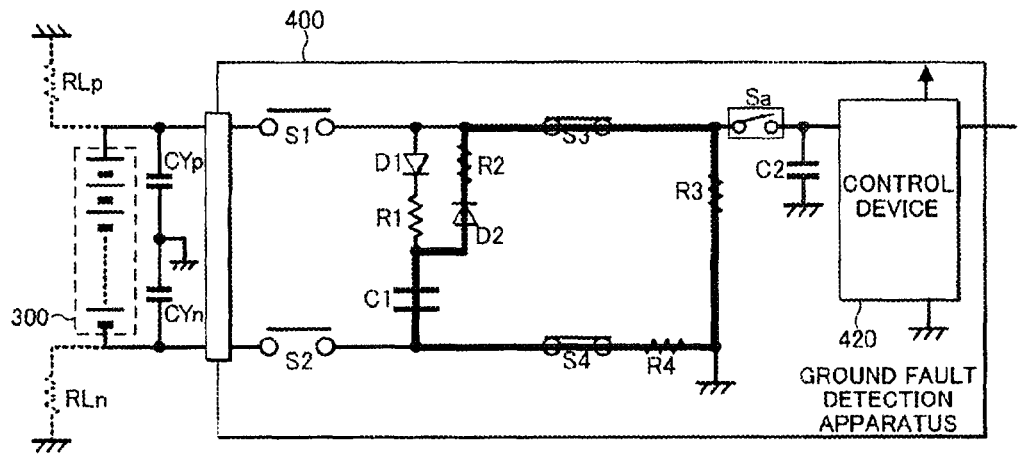
Figure 12A:
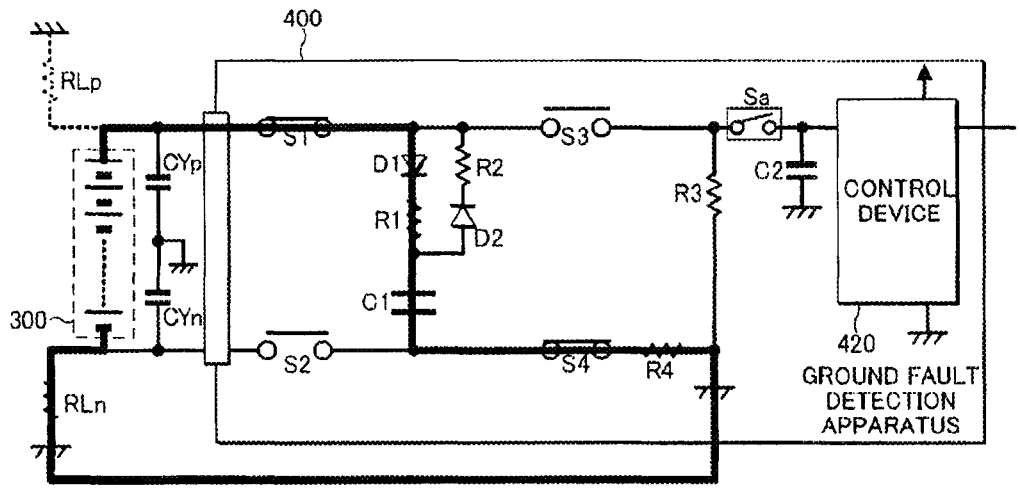
FIGS. 12A and 12B are diagrams illustrating measurement paths in a Vc1n measurement period and a Vc1p measurement period.
Figure 12B:
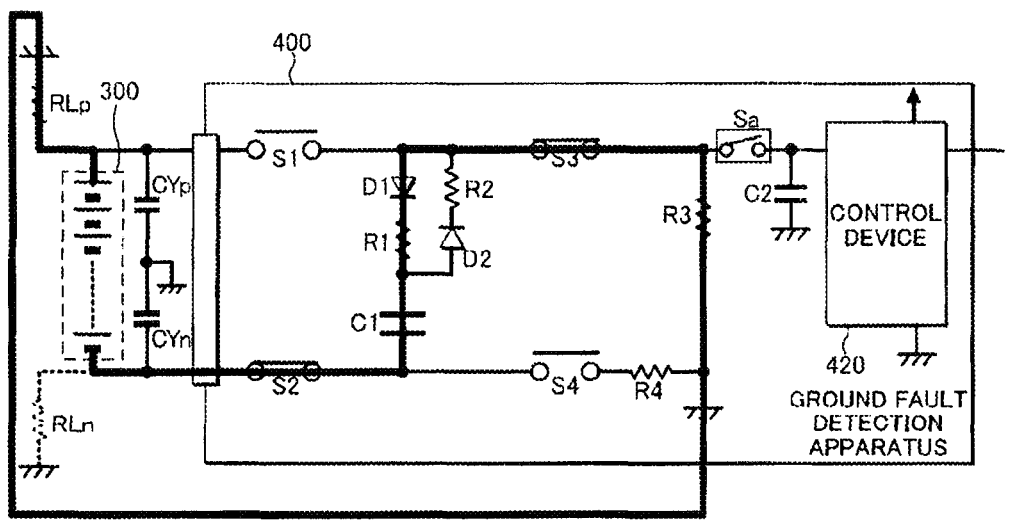

In the example of FIG. 9, the C contact switch 113a is disposed on the high voltage side of the positive-electrode-side C contact switch 111, and the C contact switch 113b is disposed on the high voltage side of the negative-electrode-side C contact switch 112. The twin relay 113 functioning as the change-over switch is controlled to be switched on and off in conjunction with one of the positive-electrode-side C contact switch 111 and the negative-electrode-side C contact switch 112 being switched to the contact a (high voltage side).

REFERENCE SIGNS LIST

100 GROUND FAULT DETECTION APPARATUS
111 POSITIVE-ELECTRODE-SIDE C CONTACT SWITCH
112 NEGATIVE-ELECTRODE-SIDE C CONTACT SWITCH
120 CONTROL DEVICE
300 HIGH-VOLTAGE BATTERY
301 POSITIVE-ELECTRODE-SIDE POWER SUPPLY LINE
302 NEGATIVE-ELECTRODE-SIDE POWER SUPPLY LINE

What is claimed is:
1. A ground fault detection apparatus that is connected to a non-grounded high-voltage battery and detects a ground fault of a system provided with the high-voltage battery, the ground fault detection apparatus comprising:
a control unit;
a detection capacitor that operates as a flying capacitor;
a positive-electrode-side first resistor connected to a positive-electrode side of the high-voltage battery;
a negative-electrode-side first resistor connected to a negative-electrode side of the high-voltage battery;
a positive-electrode-side second resistor having a first end grounded and a second end, a voltage of the second end being measured by the control unit;
a negative-electrode-side second resistor having a first end grounded;
a positive-electrode-side C contact switch that is formed as a twin relay in which a first relay and a second relay operate in conjunction with each other and alternatively switches a connection destination of a first end of the detection capacitor between a path including the positive-electrode-side first resistor and a path including the positive-electrode-side second resistor based on an instruction from the control unit; and
a negative-electrode-side C contact switch that is formed as a twin relay in which a third relay and a fourth relay operate in conjunction with each other and alternatively switches a connection destination of a second end of the detection capacitor between a path including the negative-electrode-side first resistor and a path including the negative-electrode-side second resistor based on an instruction from the control unit,
wherein the first relay is disposed so as to alternatively switch the connection destination of the first end of the detection capacitor between the path including the positive-electrode-side first resistor and one of contacts of the second relay,
the second relay functions as a change-over switch that switches a connecting state of a connected contact of the first relay and the positive-electrode-side second resistor to an off state while the first relay is being switched to the path including the positive-electrode-side first resistor,
the third relay is disposed so as to alternatively switch the connection destination of the second end of the detec- tion capacitor between the path including the negative-electrode-side first resistor and one of contacts of the fourth relay, and the fourth relay functions as a change-over switch that switches a connecting state of a connected contact of the third relay and the negative-electrode-side second resistor to an off state while the third relay is being switched to the path including the negative-electrode-side first resistor.

2. The ground fault detection apparatus according to claim 1, wherein a first change-over switch is provided on the side of the positive-electrode-side first resistor of the positive-electrode-side C contact switch and a second change-over switch is provided on the side of the negative-electrode-side first resistor of the negative-electrode-side C contact switch, and are configured to switch on and off in conjunction with the positive-electrode-side C contact switch and the negative-electrode-side C contact switch.

* * * * *